United States Patent
Takeshita et al.

(10) Patent No.: US 10,545,413 B2
(45) Date of Patent: Jan. 28, 2020

(54) EVALUATION METHOD, EXPOSURE METHOD, AND METHOD FOR MANUFACTURING AN ARTICLE

(71) Applicant: CANON KABUSHIKI KAISHA, Tokyo (JP)

(72) Inventors: Bunsuke Takeshita, Utsunomiya (JP); Yuhei Sumiyoshi, Utsunomiya (JP); Noritoshi Sakamoto, Shimotsuga-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/412,524

(22) Filed: May 15, 2019

(65) Prior Publication Data

US 2019/0361355 A1 Nov. 28, 2019

(30) Foreign Application Priority Data

May 25, 2018 (JP) ................................ 2018-100863

(51) Int. Cl.
*G03F 7/20* (2006.01)
*G02B 27/00* (2006.01)

(52) U.S. Cl.
CPC ......... *G03F 7/705* (2013.01); *G02B 27/0025* (2013.01); *G03F 7/706* (2013.01); *G03F 7/70091* (2013.01); *G03F 7/70133* (2013.01); *G03F 7/70216* (2013.01); *G03F 7/70258* (2013.01); *G03F 7/70283* (2013.01); *G03F 7/70425* (2013.01); *G03F 7/70433* (2013.01); *G03F 7/70516* (2013.01);

(Continued)

(58) Field of Classification Search
CPC ............. G03F 7/70066; G03F 7/70083; G03F 7/70091; G03F 7/70133; G03F 7/70283; G03F 7/70425; G03F 7/70433; G03F 7/705; G03F 7/70516; G03F 7/70216; G03F 7/70258; G03F 7/706; G03F 7/70891; G01M 11/0242
See application file for complete search history.

(56) References Cited

U.S. PATENT DOCUMENTS 6,563,564 B2  5/2003  de Mol et al.
8,625,069 B2  1/2014  Yabu et al.

FOREIGN PATENT DOCUMENTS

JP  2002015997 A  1/2002
JP  5406437 B2  2/2014

*Primary Examiner* — Michelle M Iacoletti
(74) *Attorney, Agent, or Firm* — Rossi, Kimms & McDowell LLP

(57) ABSTRACT

An evaluation method for evaluating an aberration of a projection optical system in an exposure apparatus is provided. A first prediction coefficient of a first prediction formula for an aberration that is symmetrical with respect to an optical axis of the projection optical system is obtained, and a second prediction coefficient of a second prediction formula for an aberration that is asymmetrical with respect to the optical axis of the projection optical system is obtained. The aberration of the projection optical system is evaluated using the first prediction coefficient in a case where the shape of the illuminated region is determined as symmetrical with respect to the optical axis, and the aberration of the projection optical system is evaluated using the first and the second prediction coefficients in a case where the shape of the illuminated region is asymmetrical with respect to the optical axis.

9 Claims, 9 Drawing Sheets

(52) U.S. Cl.
CPC ...... *G03F 7/70625* (2013.01); *G03F 7/70883* (2013.01); *G03F 7/70891* (2013.01)

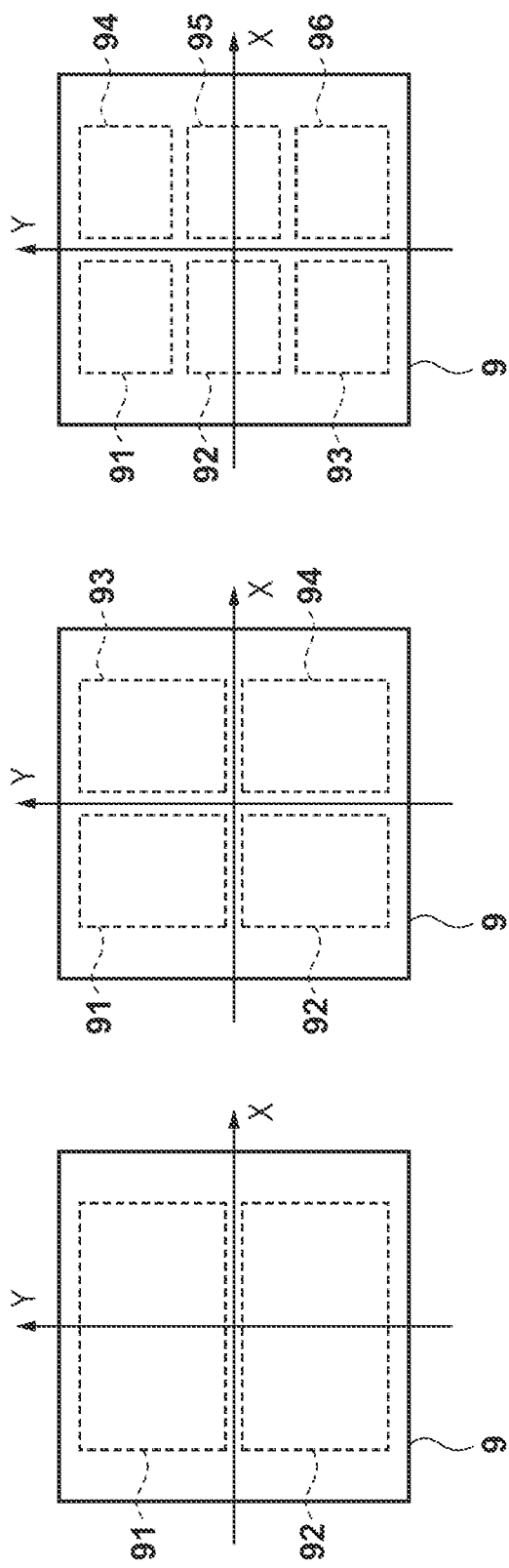

STEPPER

SCANNER

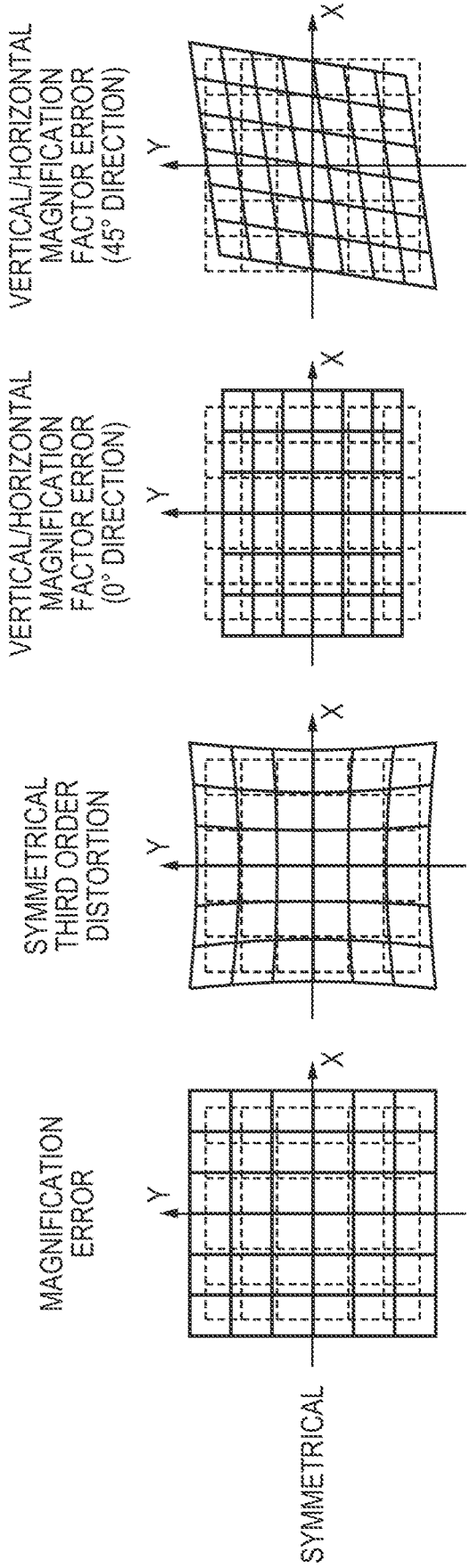
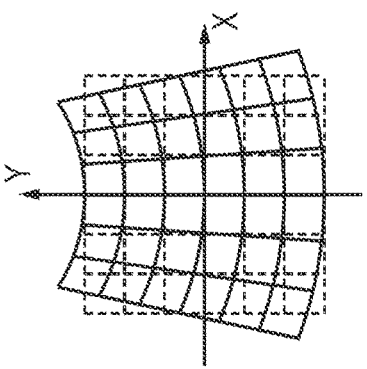
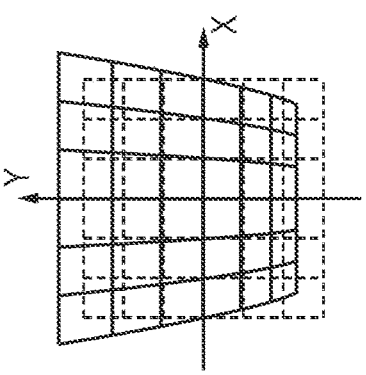
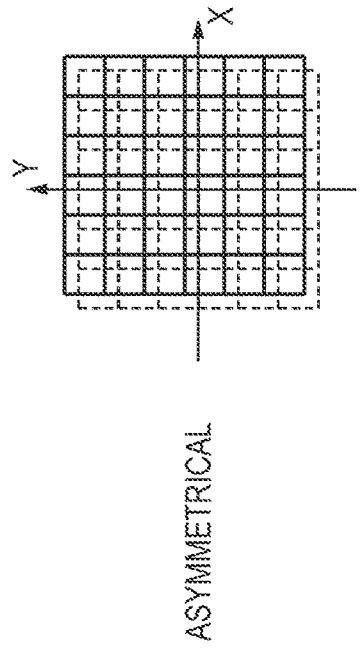

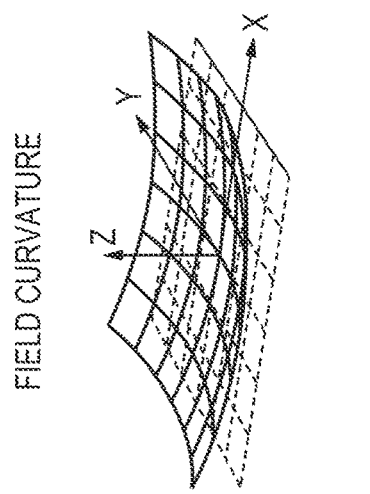
FIG. 5A
FOCUS SHIFT
SYMMETRICAL
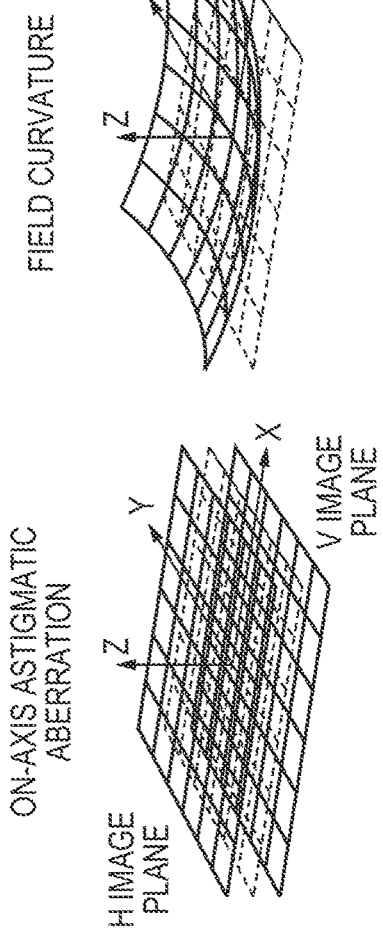
FIG. 5B
ON-AXIS ASTIGMATIC ABERRATION
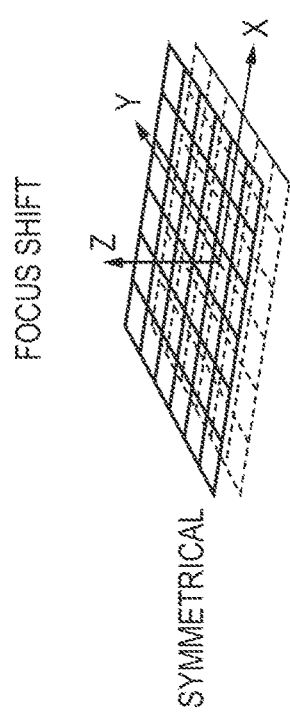
FIG. 5C
FIELD CURVATURE
FIG. 5D
ONE-SIDED DEFOCUSING
ASYMMETRICAL
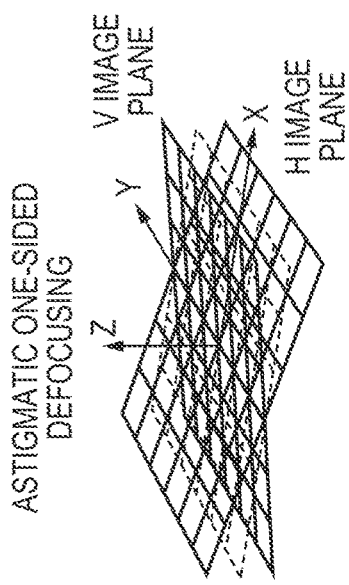
FIG. 5E
ASTIGMATIC ONE-SIDED DEFOCUSING
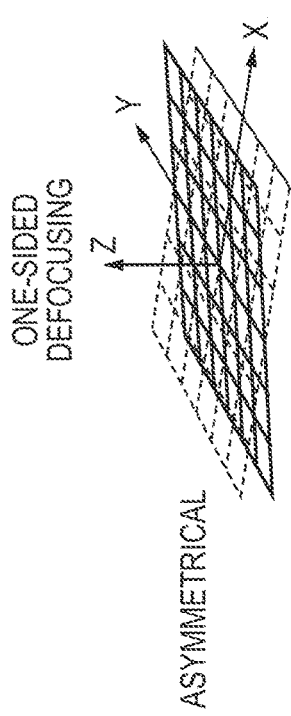

THIRD ORDER ABERRATION COMA

SYMMETRICAL

CENTRAL COMA

ASYMMETRICAL

ILLUMINATED REGION

IMAGE SHIFT (DISTORTION)

FOCUS ERROR

EVALUATION METHOD, EXPOSURE METHOD, AND METHOD FOR MANUFACTURING AN ARTICLE

BACKGROUND OF THE INVENTION

Field of the Invention

The present invention relates to an evaluation method for evaluating an aberration of a projection optical system in an exposure apparatus, an exposure method, and a method for manufacturing an article.

Description of the Related Art

It is known that imaging characteristics change in accordance with a projection optical system absorbing exposure energy in conjunction with an exposure in an exposure apparatus. A change of imaging characteristics accompanying such an exposure is called an exposure aberration. Since exposure aberrations cause a focus error or alignment error, conventionally, a correction for an exposure aberration is performed in an exposure apparatus.

Japanese Patent Laid-Open No. 2002-015997 discloses a method for predicting a change of imaging characteristics arising due to lens heating by using a function in which the influence of lens heating is modeled over time. Also, Japanese Patent No. 5406437 discloses a method for calculating, for each image height, a coefficient of a term including a time constant in an expression for calculating an aberration of a projection optical system that changes temporally with the time constant due to exposure, and for calculating the aberration for each image height based on the coefficients for each image height.

An exposure apparatus may be used in various exposure conditions such as with various effective light source shapes, with reticles of various transmittances, or with photoresists of various photosensitivity characteristics. For this reason, it is necessary to calculate an optimal correction coefficient in accordance with each exposure condition. In Japanese Patent Laid-Open No. 2002-015997, it is treated as advantageous that micro calibration of coefficients be successively performed by a plurality of different illumination settings and/or a plurality of different patterns and/or a plurality of different substrates. Also, in Japanese Patent No. 5406437, a transmittance is calculated in relation to each of a plurality of regions obtained by dividing exposure regions within a pattern. After this, an aberration that is calculated in advance and occurs for each image height in the projection optical system due to exposure by a unit exposure amount through one of the plurality of regions, and a weighting coefficient that is based on the transmittance of that one region are multiplied. Also, a coefficient for every image height is calculated by summation of the values obtained by the multiplication for the plurality of regions.

In production of semiconductor devices, a device is manufactured via multi-layer lithography steps. Accordingly, normally there is a need to prepare reticles that have differing patterns in accordance with each layer of a quantity equal to the number of layers. However, there is a method by which reuse of a single reticle in lithography steps of a plurality of layers is made possible. Different layer patterns are provided for each of a plurality of regions in one reticle, and the patterns other than that of the desired layer are blocked by a field stop in the exposure. A reticle in which such a method is employed is called a multi-layer reticle. By using such a multi-layer reticle, it is possible to reduce the number of masks, and it may be advantageous in terms of reduction of the cost according to mask preparation.

However, when exposure is performed using a multi-layer reticle, a mask ends up being illuminated asymmetrically in relation to the optical axis of the projection optical system. Thus, the projection optical system becomes heated asymmetrically in relation to the optical axis, and a decentering aberration occurs. Conventionally, correction of such a decentering aberration has not been performed.

SUMMARY OF THE INVENTION

The present invention provides, for example, a technique that is advantageous in evaluating a decentering aberration that occurs due to a projection optical system being heated asymmetrically in relation to the optical axis thereof.

The present invention in its one aspect provides an evaluation method for evaluating an aberration of a projection optical system in an exposure apparatus, the method comprising obtaining a first prediction coefficient which is a prediction coefficient of a first prediction formula which is a prediction formula for an aberration that is symmetrical with respect to an optical axis of the projection optical system, and obtaining a second prediction coefficient which is a prediction coefficient of a second prediction formula which is a prediction formula for an aberration that is asymmetrical with respect to the optical axis of the projection optical system, determining whether a shape of an illuminated region in an object plane of the projection optical system is symmetrical or asymmetrical with respect to the optical axis, and evaluating an aberration of the projection optical system using at least one of the first prediction coefficient and the second prediction coefficient, wherein the evaluating comprises evaluating the aberration of the projection optical system using the first prediction coefficient in a case where the determining determines that the shape of the illuminated region is symmetrical with respect to the optical axis, and evaluating the aberration of the projection optical system using the first prediction coefficient and the second prediction coefficient in a case where the determining determines that the shape of the illuminated region is asymmetrical with respect to the optical axis.

Further features of the present invention will become apparent from the following description of exemplary embodiments (with reference to the attached drawings).

BRIEF DESCRIPTION OF THE DRAWINGS

FIGS. 2A-2C are views illustrating examples of multi-layer reticles.

FIGS. 4A-4G are views for describing classifications of image shift errors.

FIGS. 5A-5E are views for describing classifications of focus errors.

DESCRIPTION OF THE EMBODIMENTS

Various exemplary embodiments, features, and aspects of the invention will be described in detail below with reference to the drawings.

Below, description is given in detail for embodiments of the present invention with reference to the drawings. Note that the following embodiments merely illustrate concrete examples of implementing the present invention, and the present invention is not limited to the following embodiments. In addition, not all combinations of features described in the following embodiments are essential to solving the problems that the present invention addresses.

First Embodiment

Figure 1:
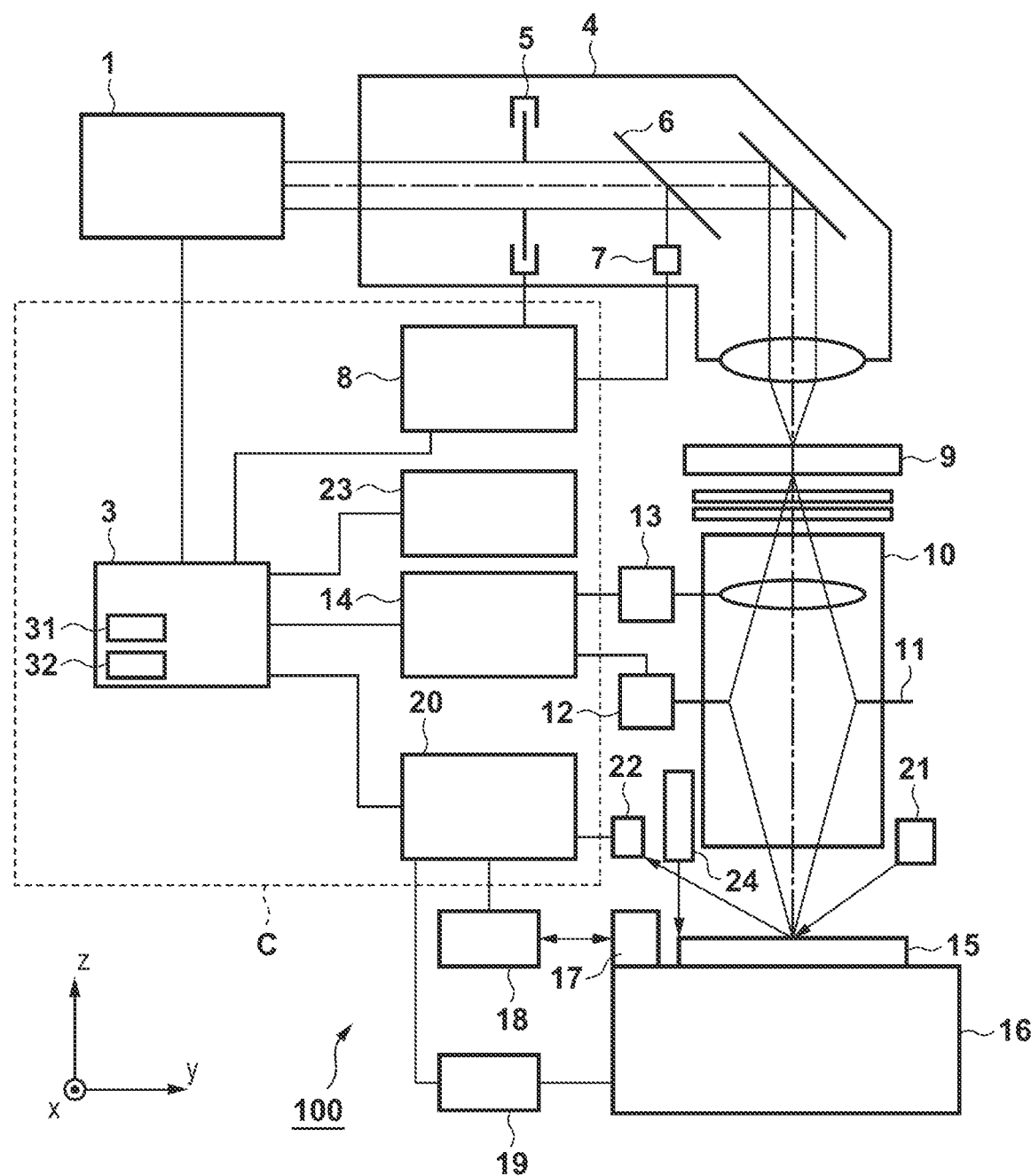
FIG. 1 is a view illustrating a configuration of an exposure apparatus in an embodiment.

FIG. 1 is a view illustrating a configuration of an exposure apparatus 100 that performs sequential exposures for each of a plurality of shot regions formed on a substrate. A light source 1 can output light of a plurality of wavelengths as exposure light. The light emitted by the light source 1 is shaped to a predetermined beam shape through a shaping optical system (not shown) of an illumination optical system 4. Additionally, the shaped beam is incident on an optical integrator (not shown), and here, a large number of secondary light sources are formed in order to illuminate a reticle 9 (mask), as a later-described original, at a uniform illuminance distribution. On the light path of the illumination optical system 4, a field stop 5, also called a masking blade, is provided, and the position and size of a diaphragm opening thereof are controlled by an illumination system controller 8. For example, the masking blade is a field stop for restricting an illuminated region to a square shape and the masking blade is configured such that the four sides of the square shape can be moved. Accordingly, any region on the mask can be illuminated.

A half-mirror 6 is arranged on the light path of the illumination optical system 4 and a portion of the exposure light that illuminates the reticle 9 is reflected by the half-mirror 6 and retrieved. A photosensor 7 for exposure light is arranged on the light path of the reflected light of the half-mirror 6. The photosensor 7 generates an output corresponding to the intensity (exposure energy) of the exposure light.

The reticle 9 may be a multi-layer reticle in which patterns for different layers are formed respectively in the plurality of regions thereof. FIGS. 2A-2C are views illustrating examples of multi-layer reticles. The reticle 9 has a plurality of regions in which patterns for respective layers are rendered. The number of regions is set as appropriate. FIG. 2A is an example in which the reticle 9 is divided into two regions and the reticle 9 has the plurality of regions: regions 91 and 92. FIG. 2B is an example in which the reticle 9 is divided into four regions and the reticle 9 has the plurality of regions: regions 91, 92, 93 and 94. FIG. 2C is an example in which the reticle 9 is divided into six regions and the reticle 9 has the plurality of regions: regions 91, 92, 93, 94, 95, and 96.

Description returns to FIG. 1. A region to be illuminated is selected from among the plurality of regions of the reticle 9 by controlling the position and size of the diaphragm opening of the field stop 5 by the illumination system controller 8. A projection optical system 10 is a refraction type or a catadioptric type projection optical system or the like, for example, and performs a reduction projection of an image of a pattern of the reticle 9 by a reduction scaling factor β (β=1/2, for example) onto one shot region on a photosensitive substrate 15 to which a photoresist has been applied.

On the pupil plane (a Fourier transform plane in relation to the reticle 9) of the projection optical system 10, an aperture stop 11 which is an approximately circular opening is arranged. The diameter of the opening of the aperture stop 11 may be controlled by a driver 12. A driver 13 causes an optical element that configures a portion of the lens system in the projection optical system 10 to move along the optical axis of the projection optical system 10. By this, while an increase of various aberrations of the projection optical system 10 is prevented, the projection scaling factor is made to be satisfactory and distortion error is reduced. A projection system controller 14, under the control of a main controller 3, controls the driver 12 and the driver 13.

It is at least possible to move and rotate a substrate stage 16 that holds the substrate 15 on the plane orthogonal to the optical axis of the projection optical system 10. In the present embodiment, the substrate stage 16 can move in three-dimensions and can move in the optical axis direction (the Z direction) of the projection optical system 10 and in a plane (the X-Y plane) orthogonal to that direction. Here, the direction toward the reticle 9 from the substrate 15 is parallel to the optical axis of the projection optical system 10 is the Z-axis, and the X-axis and the Y-axis are directions orthogonal thereto. The Y-axis extends along the paper surface and the X-axis extends toward the front direction on the paper surface. The position on the X-Y plane of the substrate stage 16 is detected by measuring by a laser interferometer 18 the distance to a moving mirror 17 fixed in the substrate stage 16. Also, a positional shift of the substrate 15 and the substrate stage 16 are measured by using an alignment measurement system 24.

A stage controller 20, under the control of the main controller 3, causes the substrate stage 16 to move to a predetermined position on the X-Y plane by controlling a driver 19 based on the result of the measurement by the alignment measurement system 24. The main controller 3, the projection system controller 14, the stage controller 20, and the illumination system controller 8 configure a controller C of the exposure apparatus 100. The main controller 3 may be configured by a computer device that includes a CPU 31 and a memory 32, for example.

A light projecting optical system 21 and a light-receiving optical system 22 configure a focus plane detector. The light projecting optical system 21 projects a plurality of light beams consisting of non-exposure light that does not sensitize the photoresist on the substrate 15 and those light beams are each focused and reflected onto the substrate 15. Light beams reflected by the substrate 15 are incident on the light-receiving optical system 22. A plurality of light-receiving elements for detecting positions are arranged to correspond to each reflected light beam within the light-receiving optical system 22 but are omitted in the figure. The light-receiving surface of each light-receiving element and reflection point of each light beam on the substrate 15 are configured by the light-receiving optical system 22 so as to be substantially conjugate. A positional shift of the surface of the substrate 15 in the optical axis direction of the projection optical system 10 is measured as a positional shift of incident beams on the light-receiving elements for detecting positions within the light-receiving optical system 22.

As described above, the reticle 9 may be a multi-layer reticle in which patterns for different layers are formed respectively in the plurality of regions thereof. When an exposure is performed by using a multi-layer reticle, a mask is illuminated in an asymmetrical shape. At this time, the light path in the projection optical system is also asymmetrical in relation to the optical axis. Thus, the projection optical system is asymmetrically heated in relation to the optical axis and a decentering aberration occurs.

Figure 3A:
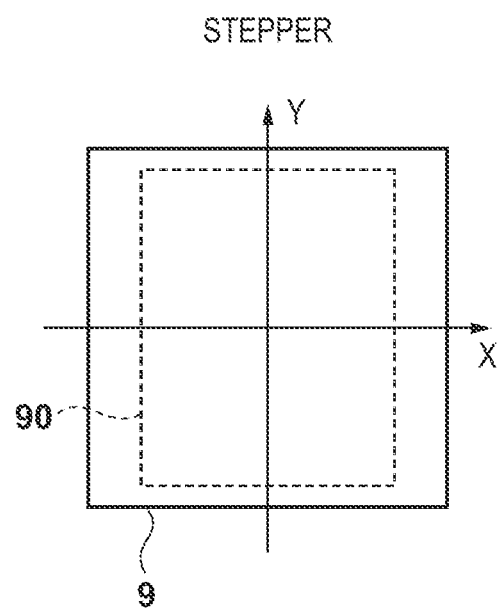
FIGS. 3A and 3B are views illustrating examples of normal single-layer reticles.
Figure 3B:
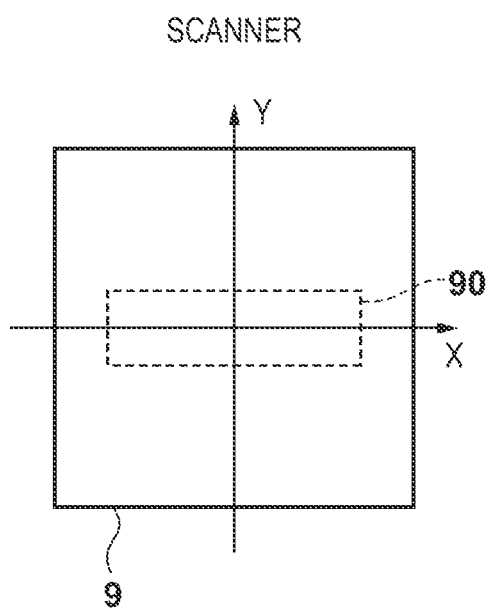

Here, description is given about what the mask being illuminated in an asymmetrical shape means. In a case where the reticle 9 is a normal single-layer reticle and not a multi-layer reticle, an illuminated region 90 of the reticle 9 arranged on the object plane of the projection optical system is a symmetrical shape in relation to the optical axis of the projection optical system as illustrated in FIGS. 3A and 3B, for example. Here, "symmetrical" means that the barycenter of the illuminated region is approximately the same as that of the optical axis of the projection optical system. In FIGS. 3A and 3B, the point of intersection between the mask plane and the optical axis of the projection optical system is the origin point. A solid line denotes the outer shape of the reticle 9 and a dashed line denotes the illuminated region 90. FIG. 3A shows a case of a step-and-repeat (stepper) method and FIG. 3B shows a case of a step-and-scan (scanner) method. In both cases, the left end and right end of the illuminated region are equidistant from the origin point and the top end and bottom end of the illuminated region are equidistant from the origin point, and it can be seen that this makes a symmetrical shape. Note that in the case of the step-and-scan method, during exposure, the reticle moves along the Y-axis while the illuminated region is fixed in relation to the projection optical system. In other words, the symmetry of the illuminated region is maintained for the projection optical system but is not maintained in relation to the reticle.

Meanwhile, in a case where exposure is performed by using a multi-layer reticle, one region from the plurality of layer regions shown in FIGS. 2A-2C becomes illuminated. Thus, the barycenter of the illuminated region (i.e., the layer region) is not the same as the optical axis of the projection optical system and the light beam passing though the projection optical system has a bias rather than being symmetrical. In the present specification, this state is referred to by "the mask is illuminated in an asymmetrical shape".

Here, description regarding an asymmetrical aberration will be given. As described below, an asymmetrical aberration includes at least one of an axis deviation, an eccentric distortion, one-sided defocusing, an on-axis coma aberration, or a one-sided defocusing astigmatic aberration. FIGS. 4A-4G are views for describing various classifications of image shift errors. Distortions (image shift in x and y axis directions) of an image in an image plane are illustrated in FIGS. 4A-4G in which an origin point is assumed to be a point of intersection between the optical axis of the projection optical system and the image plane of the projection optical system and in which the x and y axes are within the image plane. A grid of dashed lines indicates one shot in the case of an ideal projection, and a grid of solid lines indicates one shot in the case of a projection with a distortion. A magnification error in FIG. 4A, a symmetrical third order distortion in FIG. 4B, a vertical/horizontal magnification factor error (direction of 0°) in FIG. 4C, and a vertical/horizontal magnification factor error (direction of 45°) in FIG. 4D, or the like, are classified as symmetrical errors. These have a characteristic of rotational symmetry. For example, in the magnification error in FIG. 4A and the symmetrical third order distortion in FIG. 4B, there are four angles where the grid is self-overlapping in one rotation around the origin point, that is, there is fourfold symmetry. Additionally, the vertical/horizontal magnification factor error (0° direction) of FIG. 4C and the vertical/horizontal magnification factor error (45° direction) of FIG. 4D have twofold symmetry. An aberration having rotational symmetry in this way is referred to as a "symmetrical aberration".

On the other hand, in FIGS. 4A-4G, the axis deviation in FIG. 4E, the eccentric distortion (component E) in FIG. 4F, and the eccentric distortion (component F) in FIG. 4G are classified as asymmetrical errors. These lack rotational symmetry. An aberration lacking rotational symmetry in this way is referred to as an "asymmetrical aberration". Note that the eccentric distortion (component E) of FIG. 4F and the eccentric distortion (component F) of FIG. 4G exemplify eccentric distortions that orient a y direction, but in fact eccentric distortions of various orientations may occur. An axis deviation may similarly be shifted in any direction. In such a case as well, the asymmetrical property is conserved. Note, in addition to what is illustrated here, it is also possible to consider a higher-order image shift component (symmetrical and asymmetrical).

FIGS. 5A-5E are views for describing various classifications of focus errors. Focus errors (image shift in z axis direction) in an image plane are illustrated in FIGS. 5A-5E in which an origin point is assumed to be a point of intersection between the optical axis of the projection optical system and the image plane and in which the z axis is parallel to the optical axis and the x and y axes are parallel to the image plane. A grid of dashed lines indicates one shot in the case of an ideal projection, and a grid of solid lines indicates one shot in the case where there is a focus error. Note, when there are two grids of solid lines, they illustrate the following two things: One is a plane (an H image plane) which is configured by connecting best focus with respect to a horizontal pattern. The other one is a plane (a V image plane) which is configured by connecting best focus with respect to a vertical pattern (an orthogonal pattern). A phenomenon in which the H image plane and the V image plane deviate appears if there is an astigmatic aberration or the like, and the view illustrates such cases. Errors classified as symmetrical are the focus shift in FIG. 5A, an on-axis astigmatic aberration in FIG. 5B, and a field curvature in FIG. 5C. These symmetrical components have a characteristic of rotational symmetry similar to a case of an image shift. Thus, there is at least one angle where the aberration shape when is rotated around the optical axis is aligned with that before rotation. Meanwhile, errors classified as asymmetrical are the one-sided defocusing in FIG. 5D and the one-sided defocusing astigmatic aberration in FIG. 5E. These lack rotational symmetry.

Figure 6A:
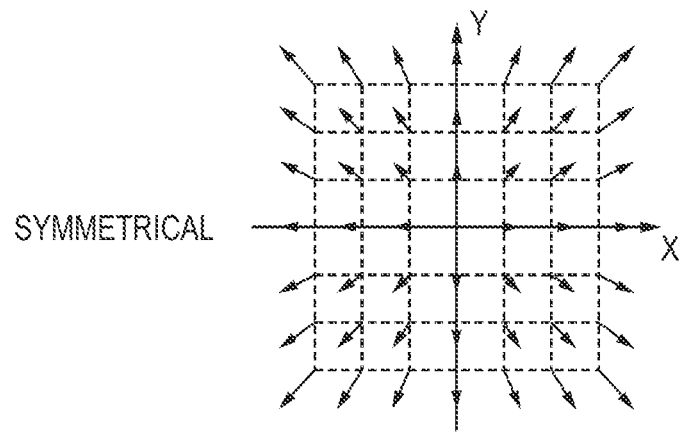
FIGS. 6A-6B are views for describing classifications of coma aberrations.
Figure 6B:
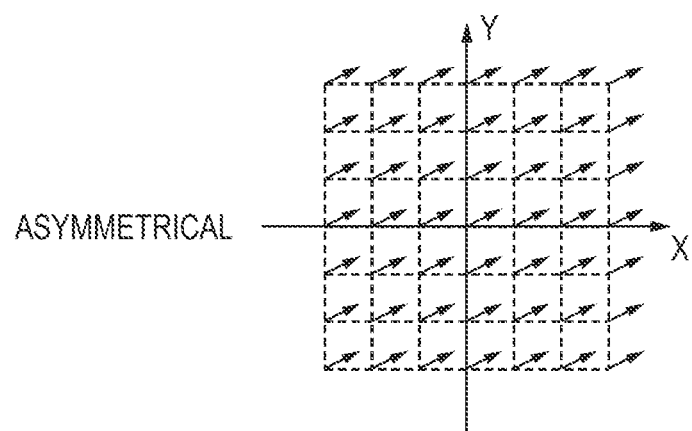

Additionally, FIGS. 6A-6B illustrate a classification of coma aberrations. FIGS. 6A-6B illustrates coma aberration size and direction in the image plane by vectors where an origin point is assumed to be a point of intersection between the optical axis of the projection optical system and the image plane and in which the x and y axes are parallel to the image plane. An error classified as symmetrical is third order aberration coma in FIG. 6A. The coma occurs isotropically in proportion to a distance from the origin point and has a symmetrical shape. On the other hand, an error classified as asymmetrical is central coma in FIG. 6B. This lacks rotational symmetry because coma of the same size and the same direction occurs uniformly in a screen. Note that, FIG. 6B illustrates central coma that is oriented in one direction, and coma aberration may in fact occur in any direction.

The above is a description of representative symmetrical and asymmetrical aberration. Here, distortion, focus error, astigmatic aberration, and coma aberration, as well as other aberration components can be considered in the same way to be asymmetrical components. For example, each component of a wavefront aberration represented by a Zernike polynomial expansion can be considered to be a component distributed asymmetrically in the image plane.

Figure 7A:
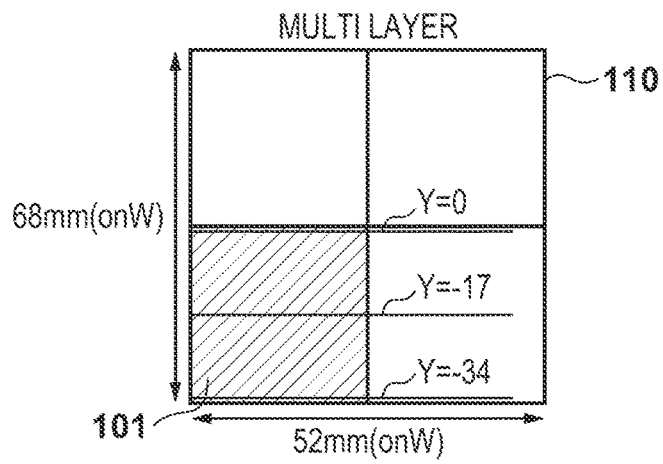
FIGS. 7A-7C are views for describing exposure aberrations that occur in cases where the exposure is performed by using a multi-layer reticle.
Figure 7B:
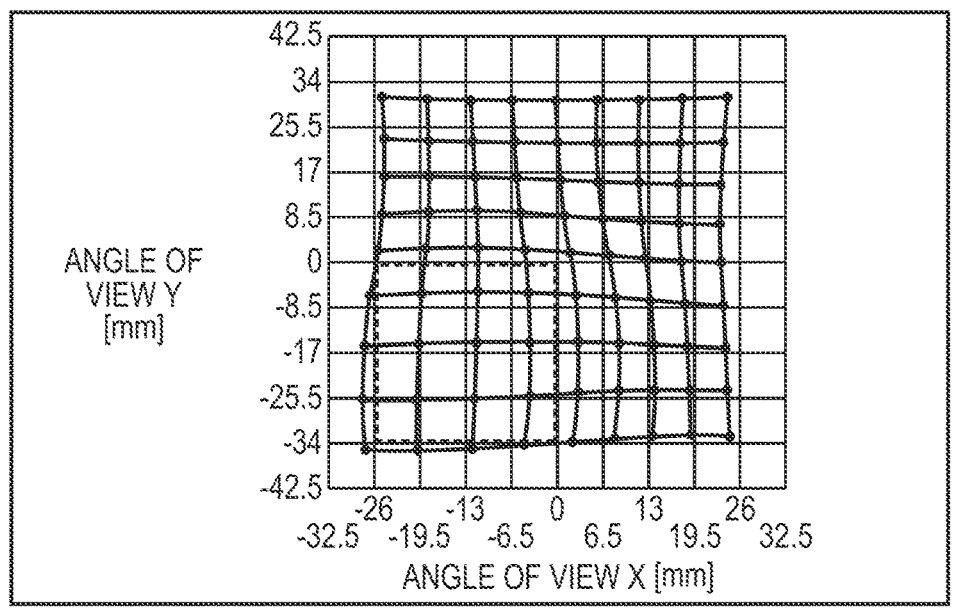
Figure 7C:
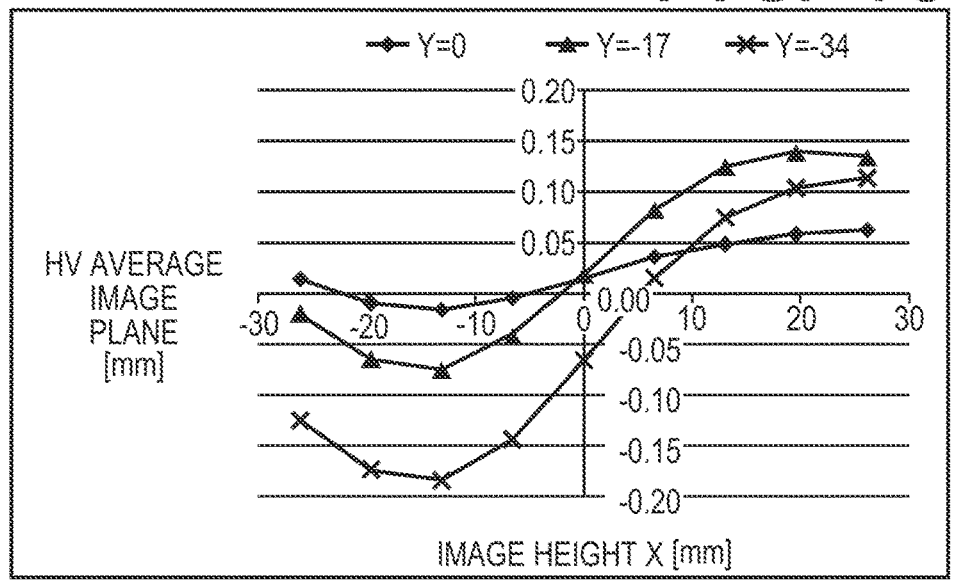

The inventor found that the aberration of asymmetrical components, as described above, occurs as an exposure aberration if exposure is performed using a multi-layer reticle. FIGS. 7A-7C illustrate exposure aberration which is obtained by a simulation and which is occurs if exposure is performed using a multi-layer reticle. FIG. 7A illustrates a maximum exposable region 110 in the projection optical system and a region 101 which is actually used for exposure. FIG. 7B illustrates an image shift (distortion) that occurs at that time. Additionally, FIG. 7C illustrates focus error generated at that time. In all of these it can be seen that the error occurs concentratedly in a portion used for exposure, and has an asymmetrical shape when considering the entirety of the maximum exposure region. It is difficult to express such an asymmetrical aberration with a combination of the conventional symmetrical aberrations such as magnification variation, symmetrical third order distortion, vertical/horizontal magnification factor error, focus shift, and field curvature. Accordingly, in such symmetrical aberration based systems, it is difficult to predict the amount of asymmetrical exposure aberration that will occur or to perform correction thereof.

Note that in Japanese Patent No. 5406437, since an exposure aberration coefficient is held for each image height, it can be said there is the possibility that such asymmetrical aberration component can be handled. However, since it is necessary to hold a coefficient (parameter) for each image height, there is a problem in that the number of parameters to be determined is large, and the number of experiments to be performed to obtain the parameters is large and is time consuming. In contrast to this, the present embodiment makes it possible to correct, by a simple method, asymmetrical exposure aberration that occurs when exposure is performed on an asymmetrical exposure region as with the multi-layer reticle.

Figure 8:
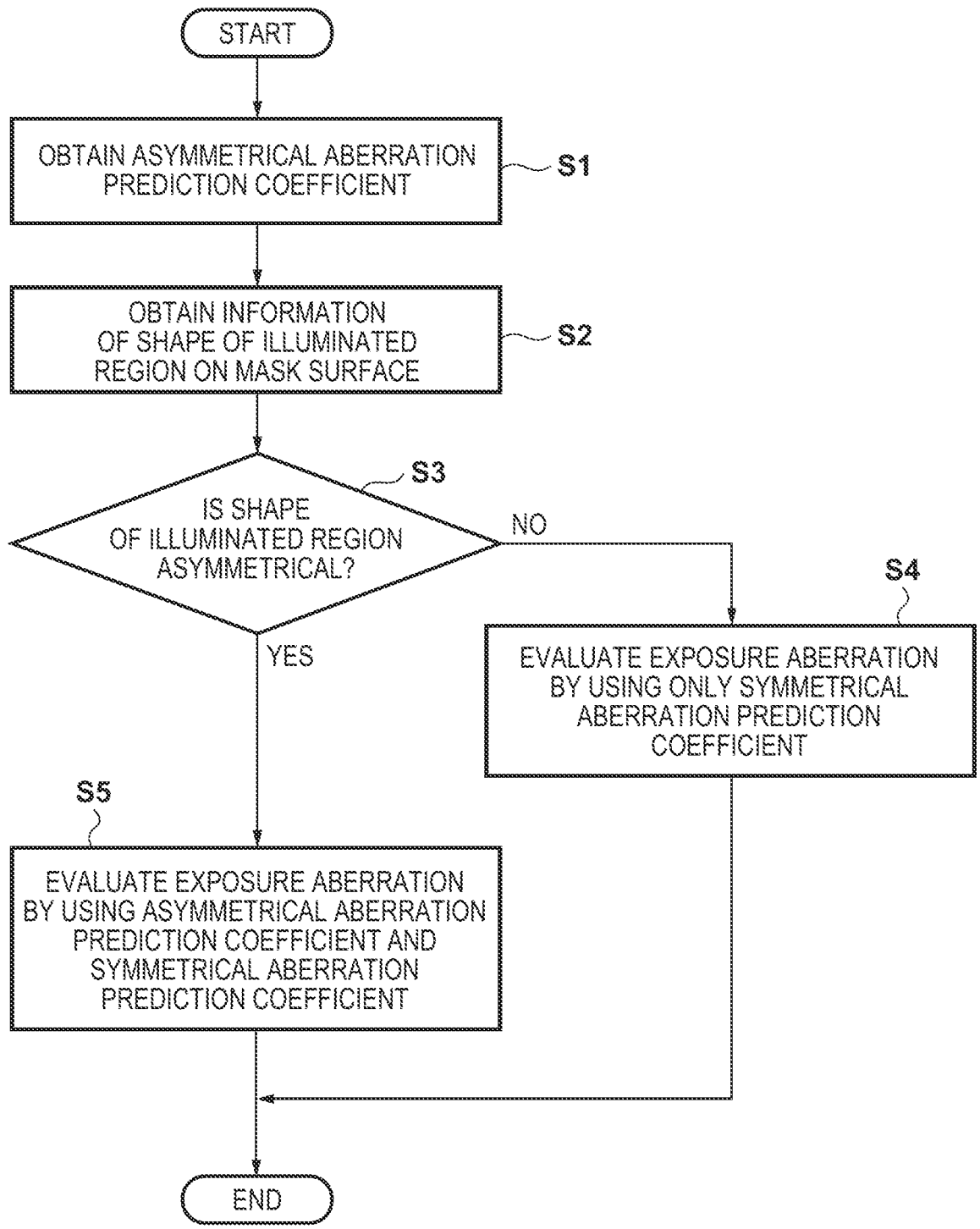
FIG. 8 is a flowchart of a method for evaluating an exposure aberration in the embodiment.

FIG. 8 is a flowchart of a method for evaluating an exposure aberration in the embodiment. The main controller 3 obtains a prediction coefficient for asymmetrical aberration in step S1. Below, description regarding specific details of step S1 will be given.

In step S1, prediction coefficients for asymmetrical aberration are obtained by experimentation using the exposure apparatus 100 in advance prior to device manufacture. If exposure apparatuses are of the same model, standard prediction coefficients calculated using one apparatus may be applied to other apparatuses unchanged. Note that, since there are cases that prediction coefficients differ slightly depending on individual differences between apparatuses or the like, the prediction coefficients may be recalculated by experiment using each apparatus in a case where prediction coefficients with high accuracy are required.

Experimentation for obtaining the prediction coefficient may be performed at the time of an assembly/adjustment step in the factory or may be performed at the time of apparatus installation. Alternatively, the experimentation may additionally be performed whenever there is an opportunity to use a multi-layer reticle. In a case where a multi-layer reticle to be used is identified, a prediction coefficient with higher accuracy can be obtained by obtaining the prediction coefficient using that reticle.

Hereinafter, detailed description is given regarding a method for obtaining a prediction coefficient for asymmetrical aberration. First, to obtain a prediction coefficient for asymmetrical aberration, the field stop 5 is set to a local arrangement so that only one part of the maximum exposure region is used similarly to when using a multi-layer reticle. Next a reticle for testing is set in the exposure apparatus 100. The reticle for testing is a reticle in which marks needed to measure focus error and image shift error are arranged at a sufficient quantity in the exposure region. For example, these marks are arranged in a grid pattern on the reticle for testing. Note that, the actual multi-layer reticle for manufacturing the semiconductor device may be used as long as marks necessary for measuring the focus error or the image shift error are arranged thereon. Next, under this exposure condition, focus error and image shift error are measured in each of a plurality of exposure processes. For example, exposure is performed on a plurality of sample substrates (for example, from a several to several hundred), and the focus error and the image shift error are measured at a plurality of measurement points in each shot of these sample substrates. Note that, since the exposure aberration has the property that it rapidly changes in an initial period of the start of exposure and it saturates gradually, measurement may be performed by extracting some rather than all of the sample substrates exposed after the saturation stage is reached. Further, using the property of the exposure aberration as described above, exposure may be performed in a sequence such that the substrates are exposed mixing in dummy light-exposure as appropriate.

The main controller 3 obtains time-series data for symmetrical aberration and asymmetrical aberration based on the results of the above measuring. Specifically, the main controller 3 decomposes the result of measurement of focus error and image shift error obtained by measurement at each measurement point using a method such as a least squares method. In the case of focus error, decomposition by terms including components of asymmetrical aberration in addition to symmetrical aberration, such as, for example, focus shift, on-axis astigmatism, field curvature, one-sided defocusing, and one-sided defocusing astigmatic aberration is performed. Further, in a case of image shift error, decomposition by terms including components of asymmetrical aberration in addition to symmetrical aberration, such as, for example magnification error, symmetrical third order distortion, axis deviation, eccentric distortion and the like is performed. In this way, time series fluctuation data for each aberration component is obtained.

The main controller 3 fits a model expression (prediction formula) to time series fluctuation data for each aberration component thus obtained, and ultimately obtains the prediction coefficients. For example, the following expressions can be used as model expressions for fitting.

$$F(t)=A_1(1-e^{-t/\tau_1})+A_2(1-e^{-t/\tau_2})$$

$$G(t)=B_1(1-e^{-t/\nu_1})+B_2(1-e^{-t/\nu_2})$$

Here, F represents the amount of change for a symmetrical aberration of interest, G represents the amount of change for an asymmetrical aberration of interest, t represents time, $\tau_1$, $\tau_2$, $\nu_1$, and $\nu_2$ represent time constants, and $A_1$, $A_2$, $B_1$, and $B_2$ represent amplitudes. In such a case, the 4 parameters $A_1$, $A_2$, $\tau_1$, and $\tau_2$ are referred to as a prediction coefficient for symmetrical aberration (first prediction coefficient), and 4 parameters $B_1$, $B_2$, $\nu_1$, and $\nu_2$ are referred to as a prediction coefficient for asymmetrical aberration (second prediction coefficient). Note, it is a feature that in addition to a first prediction formula, which is a prediction formula for symmetrical aberration, a second prediction formula, which is a prediction formula for asymmetrical aberration is newly added. Conventionally, such a prediction formula for asymmetrical aberration is not considered.

Both the time constants and the coefficients are obtained by fitting. Alternatively, configuration may be such that the time constants are fixed and only the coefficients are obtained using fitting if the time constants are known in advance. Note that $A_1$, $A_2$, $B_1$, and $B_2$ are functions of an energy amount (unit: W) per unit time which is applied to the projection optical system. In a simple model, $A_1$, $A_2$, $B_1$, and $B_2$ are proportional to the energy amount per unit time applied to the projection optical system. In such a situation, $A_1$, $A_2$, $B_1$, and $B_2$ may be standardized by the energy amount per unit time applied to the projection optical system. Accordingly, a prediction of aberration during actual device manufacturing can be calculated by multiplying the above equation by the energy amount during device manufacturing (for example, per 1 W). Note that, since both a symmetrical aberration component and an asymmetrical aberration component are used for the component decomposition, what is obtained here is prediction coefficients for both the symmetrical aberration component and the asymmetrical aberration component. In a case where the prediction of aberration is performed using a prediction coefficient for an asymmetrical aberration component, it is always necessary to use a prediction coefficient for a symmetrical component calculated in a set therewith for prediction for a symmetrical aberration component. Accordingly, these coefficients are saved in association in the exposure apparatus, and they are always used as a set.

By the processing described above, a prediction coefficient for symmetrical aberration and a prediction coefficient for asymmetrical aberration can be obtained. The obtained prediction coefficient is saved in the memory 32 of the exposure apparatus 100. Note that various region shapes can be considered for an illuminated region for which a multi-layer reticle is envisioned. As shown in FIGS. 2A-2C, this is because various patterns can be considered for the layer division method for the multi-layer reticle. A plurality of prediction coefficients corresponding to various illuminated region patterns may be obtained and all of them may be saved in the exposure apparatus. Further, since the exposure aberration may change depending on an exposure condition such as the NA or the effective light source, it is more effective to save prediction coefficients obtained by changing these conditions for an improvement in accuracy.

Next, in step S2, the main controller 3 obtains information of the shape of the illuminated region on the mask surface. Control of the exposure apparatus 100 is performed by a user setting parameters and jobs in the exposure apparatus 100 through a console or online. Up, down, left and right blade position information for the field stop 5 (a masking blade) is also one such parameter. Accordingly, when the user inputs setting values for the masking blade to the exposure apparatus 100, the shape of the illuminated region is set in the exposure apparatus 100, and by this the exposure apparatus 100 obtains the information of the shape of the illuminated region. Alternatively, the exposure apparatus 100 may have a file called a "recipe" which describes a complete set of parameters of an exposure condition. A user may save various parameters of an exposure condition as the recipe in the exposure apparatus 100 in advance, and then the recipe may be called as appropriate to collectively set parameters when actual exposure is performed. The setting value of the masking blade is also information saved in the recipe, and the setting value of the masking blade is set as a state of the exposure apparatus 100 by the user calling the recipe. In other words, the shape of the illuminated region is set in the exposure apparatus 100 when the user calls the recipe, and by this, the exposure apparatus 100 obtains the information of the shape of the illuminated region.

Next, the main controller 3 determines whether a shape of the illuminated region is symmetrical or asymmetrical in step S3. This is performed as follows. For example, the main controller 3 determines whether a shape of the illuminated region is symmetrical or asymmetrical based on information obtained in step S2 using a calculation. For example, in a case where a condition that the center of gravity of the exposure region is sufficiently close to the optical axis of the projection optical system is satisfied, it can be determined that the shape of the illuminated region is symmetrical. Alternatively, in a case where the condition that the top edge and the bottom edge, and the left edge and the right edge of the masking blade are respectively substantially equidistant from optical axis of the projection optical system is satisfied, it can be determined that the shape of the illuminated region is symmetrical. Further, the user may determine whether the shape of the illuminated region is symmetrical or asymmetrical, and input the result to the exposure apparatus 100. Alternatively, the user may input the shape of the "effective" illuminated region to the exposure apparatus 100. This is because the reticle may be provided with a light-shielded band, and when the width of the light-shielded band is large, the illuminated region defined by the masking blade may not necessarily coincide with the region that is actually exposed. In such a case, the user may manually input information to the exposure apparatus. Further, in a case where the reticle that is being used is a multi-layer reticle in which patterns of different layers are formed respectively in a plurality of regions, it may be determined that the shape of the illuminated region is asymmetrical.

In step S4 and step S5, aberration of the projection optical system is evaluated using at least one of a prediction coefficient for symmetrical aberration (first prediction coefficient) and a prediction coefficient for the asymmetrical aberration (second prediction coefficient). Specifically, in a case where it is determined that the shape of the illuminated region is symmetrical, the main controller 3 evaluates exposure aberration using only the prediction coefficient for symmetrical aberration in step S4. Below, this will be described in detail. In a case where it is determined that the shape of the illuminated region is symmetrical, the main controller 3 reads out a prediction coefficient for symmetrical aberration from the memory 32. In some cases, a plurality of prediction coefficients obtained under different conditions related to NA, effective light source shape, screen size, or the like, are stored in the memory 32. In such a case, the main controller 3 may, based on the NA, the effective light source, and masking blade position information (screen size information) recorded in a recipe, interpolate a plurality of prediction coefficients for different conditions to generate, and then use, a new prediction coefficient. A prediction coefficient used in a recipe is determined by such processing. Note that it is typical that a prediction coefficient for symmetrical aberration, differently to a prediction coefficient for asymmetrical aberration, is obtained in an exposure apparatus assembly/adjustment step or an installation step. Thus, when exposure starts, an amount of aberration is calculated and predicted in accordance with a model expression from energy per unit time applied in the projection optical system and elapsed time.

In a case where it is determined that the shape of the illuminated region is asymmetrical, the main controller 3 evaluates exposure aberration using the prediction coefficient for asymmetrical aberration and the prediction coefficient for symmetrical aberration in step S5. Hereinafter, this will be described in detail. In a case where the shape of the illuminated region is determined to be asymmetrical, the main controller 3 reads from the memory 32 a prediction coefficient for asymmetrical aberration and a prediction coefficient for symmetrical aberration that forms a set therewith. In a case where a plurality of asymmetrical prediction coefficients obtained under different conditions are stored in the memory 32, configuration may be taken to read the prediction coefficient obtained under the most similar conditions, based on the NA, the effective light source, and position information for the masking blade (or shape information of the effective illuminated region that the user inputted). Alternatively, a new prediction coefficient that is generated by interpolating a plurality of prediction coefficients whose conditions are different may be used. A prediction coefficient used in a recipe is determined by such processing. Also, the determined prediction coefficient is associated with the recipe. Then, when exposure starts, an amount of aberration is calculated and predicted (evaluated) in accordance with a model expression from energy per unit time applied in the projection optical system and elapsed time.

As described above, after the amount of aberration is evaluated, the main controller 3 performs the exposure while adjusting the exposure apparatus so that the predicted amount of aberration is corrected based on the evaluation result. It is possible to correct symmetrical aberration components by a correction system provided in the exposure apparatus conventionally. For example, a magnification error or a symmetrical third order distortion of an image shift error can be corrected by moving some of the lenses that comprise the projection optical system in parallel to the optical axis. Also, a vertical/horizontal magnification factor error of an image shift error can be corrected by configuring an Alvarez optical element in a projection optical system. Also, a focus shift of a focus error can be corrected by moving the substrate stage. For example, field curvature can be corrected by moving some of the lenses that comprise the projection optical system in parallel to the optical axis.

Furthermore, it is possible to correct asymmetrical aberration by changing the exposure apparatus parameters. For example, an axis deviation can be corrected by moving the substrate stage. Also, an eccentric distortion (E, F components) can be corrected by slightly rotating some of the lenses that comprise the projection optical system with an axis orthogonal to the optical axis as the axis of revolution, or by moving the lenses orthogonally to the optical axis. Also, one-sided defocusing can be corrected by tilting the substrate stage. Also, one-sided defocusing astigmatic aberration and central coma, similarly to eccentric distortion, can be corrected by slightly rotating some of the lenses that comprise the projection optical system with an axis orthogonal to the optical axis as the axis of revolution, or by moving the lenses orthogonally to the optical axis. In this way, by virtue of the present embodiment, it is possible to correct not only symmetrical aberration as was done conventionally, but also to correct asymmetrical aberration. This is a feature that conventional methods lacked. In other words, by virtue of the present embodiment, prediction and correction of exposure aberration is performed using an asymmetrical aberration component for which a correction method exists. In this way, it is possible to smoothly connect prediction to subsequent correction.

In contrast to this, with the method in Japanese Patent No. 5406437, since aberration prediction is performed for each image height, it cannot be known immediately whether or not what could be predicted is a correctable component. Also, a complicated calculation is necessary for computation of motion amounts of the correction system from predicted aberration. Also, in the method of Japanese Patent No. 5406437, since a prediction coefficient is held for each image height, there is more susceptibility to the effect of measurement error when calculating the prediction coefficient, and there is a corresponding possibility that the prediction accuracy will be lower. Meanwhile, by the method of the present embodiment, prediction coefficients are held after having been converted into aberration components, rather than for each image height. Since processing for fitting between image heights is included, there is a robustness against errors, and an improvement in accuracy can be expected.

As described above, by switching the coefficients used for prediction of the exposure aberration depending on whether the illuminated region is symmetrical or asymmetrical with respect to the optical axis of the projection optical system, it is possible to easily perform more accurate evaluation and correction of aberration than conventionally. Consequently, it is possible to contribute to an improvement in accuracy and an improvement in yield of semiconductor devices.

Second Embodiment

Figure 9:
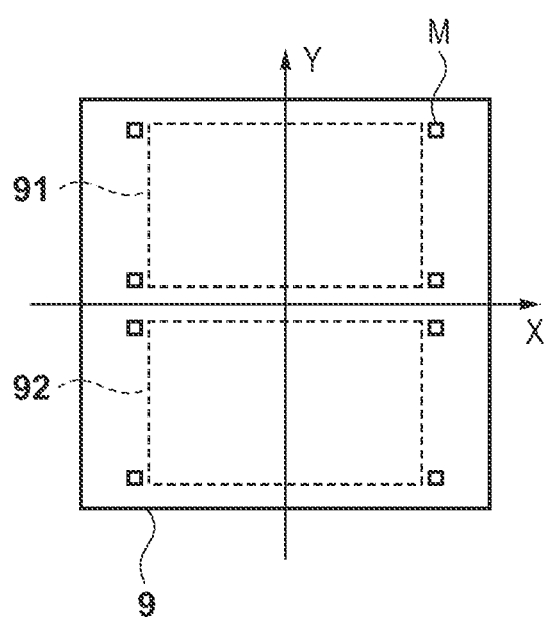
FIG. 9 is a view illustrating an example of a multi-layer reticle having a mark.

Description is given below regarding an exposure method in a second embodiment. FIG. 9 illustrates the reticle 9 which is a multi-layer reticle used the present embodiment. In the surroundings of each of a plurality of regions 91 and 92 used in exposure, a plurality of marks M for measuring focus/image shift are provided. The present embodiment is the same as the first embodiment on the point that it evaluates and corrects asymmetrical exposure aberration when using a multi-layer reticle. However, the present embodiment differs from the first embodiment in that the main controller 3 measures an asymmetrical aberration between exposure sequences, and feeds that back into the asymmetrical aberration prediction coefficient.

For example, it is possible to consider arranging horizontal and vertical transmissive line/space patterns as marks M for measurement. At specific positions different to that of the substrate on the substrate stage, a similar line/space pattern shaped transmissive window and a light amount sensor therebelow are arranged. When a mark M for measurement is illuminated with illumination light, an aerial image of the line/space pattern is formed on the image plane close to the substrate stage surface via the projection optical system. This aerial image is measured by the transmissive window and light amount sensor therebelow. Light amounts are measured while shifting the substrate stage surface in a defocus direction and a lateral direction, and the shift amount in the defocus direction and the shift amount in the lateral direction where the light amount becomes a maximum are the best focus point and the best shift point, respectively.

Such marks are provided, and for example, at a timing at which substrates are switched, the marks M at four points in the periphery of the layer being exposed are measured (measurement of focus error and image shift error). Then, from the information of the focus error and the image shift error of the four points, component decomposition into a symmetrical aberration component and an asymmetrical aberration component by a least squares method, or the like, is performed. By doing so, the amount of aberration actually occurring can be known. By comparison against the predicted value for aberration calculated from a prediction coefficient, it can be confirmed whether prediction can be made with high accuracy. Thus, it is possible to improve the prediction accuracy by feeding back the difference between the prediction and the amount of aberration actually occurring into the prediction coefficient.

For example, focus error and image shift error are measured between exposure sequences, actual symmetrical aberration and asymmetrical aberration data is obtained based on the measurement results, and a first prediction coefficient and a second prediction coefficient are corrected based on the obtained data. Accordingly, it is possible to achieve an improvement in accuracy of the prediction coefficient.

Embodiment of Method of Manufacturing Article

A method of manufacturing an article according to an embodiment of the present invention is suitable to manufacturing an article such as an element having a microstructure or micro-device such as a semiconductor device, for example. The method of manufacturing an article according to this embodiment includes a step of forming, using the above-described exposure apparatus, a latent image pattern on a photoresist applied to a substrate (a step of exposing a substrate), and a step of developing the substrate with the latent image pattern formed in the above step. The manufacturing method also includes other known steps (for example, oxidation, deposition, vapor deposition, doping, planarization, etching, resist removal, dicing, bonding, and packaging). The method of manufacturing an article of the present embodiment is advantageous in at least one of capability, quality, productivity, and manufacturing cost of the article in comparison to a conventional method.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-100863, filed May 25, 2018, which is hereby incorporated by reference herein in its entirety.

What is claimed is:

1. An evaluation method for evaluating an aberration of a projection optical system in an exposure apparatus, the method comprising:
   obtaining a first prediction coefficient which is a prediction coefficient of a first prediction formula which is a prediction formula for an aberration that is symmetrical with respect to an optical axis of the projection optical system, and obtaining a second prediction coefficient which is a prediction coefficient of a second prediction formula which is a prediction formula for an aberration that is asymmetrical with respect to the optical axis of the projection optical system;
   determining whether a shape of an illuminated region in an object plane of the projection optical system is symmetrical or asymmetrical with respect to the optical axis; and
   evaluating an aberration of the projection optical system using at least one of the first prediction coefficient and the second prediction coefficient, wherein the evaluating comprises:
   evaluating the aberration of the projection optical system using the first prediction coefficient in a case where the determining determines that the shape of the illuminated region is symmetrical with respect to the optical axis, and
   evaluating the aberration of the projection optical system using the first prediction coefficient and the second prediction coefficient in a case where the determining determines that the shape of the illuminated region is asymmetrical with respect to the optical axis.

2. The evaluation method according to claim 1, wherein the obtaining comprises:
   measuring a focus error and an image shift error in each of a plurality of exposure processes,
   obtaining, based on a result of the measuring, time-series data of the symmetrical aberration and the asymmetrical aberration, and
   obtaining the first prediction coefficient by fitting the first prediction formula to the time-series data of the symmetrical aberration, and obtaining the second prediction coefficient by fitting the second prediction formula to the time-series data of the asymmetrical aberration.

3. The evaluation method according to claim 2, wherein the plurality of exposure processes include a plurality of exposure processes for which illuminated regions thereof are respectively different.

4. The evaluation method according to claim 1, wherein the determining, in a case where a center of gravity of an exposure region is close to the optical axis, determines that the shape of the illuminated region is symmetrical with respect to the optical axis.

5. The evaluation method according to claim 1, wherein the determining, in a case in which a mask is a multi-layer reticle in which different patterns of layers are respectively formed in a plurality of regions, determines the shape of the illuminated region to be asymmetrical.

6. The evaluation method according to claim 1, further comprising measuring a focus error and an image shift error between exposure sequences, obtaining data of the symmetrical aberration and the asymmetrical aberration based on a result of the measuring, and based on the obtained data, correcting the first prediction coefficient and the second prediction coefficient.

7. The evaluation method according to claim 1, wherein the asymmetrical aberration includes at least one of axis deviation, eccentric distortion, one-sided defocusing, on-axis coma aberration, and one-sided defocusing astigmatic aberration.

8. An exposure method performed by an exposure apparatus that projects a pattern formed on a mask onto a substrate via a projection optical system, and exposes the substrate, the method comprising:
   evaluating an aberration of the projection optical system by using the evaluation method according to claim 1;
   adjusting the exposure apparatus based on a result of the evaluation; and
   exposing the substrate using the adjusted exposure apparatus.

9. A method for manufacturing an article, comprising:
   exposing a substrate in accordance with the exposure method according to claim 8; and
   developing the exposed substrate,
   wherein the article is manufactured from the developed substrate.

* * * * *